United States Patent
Chiang et al.

(10) Patent No.: US 10,699,540 B2
(45) Date of Patent: Jun. 30, 2020

(54) ELECTRONIC DEVICE THAT CAN DETECT AND REPORT TAMPERING

(71) Applicant: Sercomm Corporation, Taipei (TW)

(72) Inventors: Meng-Chien Chiang, Taipei (TW); Wen-Chin Wang, Taipei (TW)

(73) Assignee: Sercomm Corporation, Taipei (TW)

( * ) Notice: Subject to any disclaimer, the term of this patent is extended or adjusted under 35 U.S.C. 154(b) by 0 days.

(21) Appl. No.: 16/516,239

(22) Filed: Jul. 18, 2019

(65) Prior Publication Data

US 2020/0118404 A1   Apr. 16, 2020

(30) Foreign Application Priority Data

Oct. 11, 2018   (CN) .................. 2018 2 1648510 U

(51) Int. Cl.
  *G08B 13/02*   (2006.01)
  *H02J 9/06*    (2006.01)
  *H05K 5/02*    (2006.01)

(52) U.S. Cl.
  CPC .............. *G08B 13/02* (2013.01); *H02J 9/061* (2013.01); *H05K 5/0217* (2013.01)

(58) Field of Classification Search
  None
  See application file for complete search history.

(56) References Cited

U.S. PATENT DOCUMENTS

| | | | | |
|---|---|---|---|---|
| 4,620,182 A * | 10/1986 | Keifer | ................ | G08B 13/1463 340/568.2 |
| 5,103,221 A * | 4/1992  | Memmola | ................ | G07C 9/28 340/5.31 |
| 5,148,159 A * | 9/1992  | Clark | ................ | G07C 9/00182 340/12.28 |
| 5,172,097 A * | 12/1992 | Arnold | ................ | E05B 15/101 340/543 |
| 5,301,231 A * | 4/1994  | Abraham | ............ | G06F 9/30003 235/379 |
| 5,748,083 A * | 5/1998  | Rietkerk | .............. | G08B 13/128 340/568.2 |
| 5,790,670 A * | 8/1998  | Bramlett | ............ | G08B 13/1409 200/43.09 |
| 6,054,920 A * | 4/2000  | Smith | .................... | G08B 25/10 340/506 |
| 6,420,972 B1* | 7/2002  | Loose | .................... | G07F 17/32 219/721 |

(Continued)

*Primary Examiner* — Curtis J King
(74) *Attorney, Agent, or Firm* — Winston Hsu

(57) ABSTRACT

An electronic device that can detect and report tampering, comprising: a case, comprising an installation surface, wherein the electronic device is for being installed to an installation position via the installation surface; a battery, located inside the case, configured to provide battery power; a temporary power storage circuit, located in the case; a power off switch, located on the case and coupled between the battery and the temporary power storage circuit, configured to operate in a conductive state while the electronic device is installed at the installation position, and configured to automatically operate in a power off state after the electronic device being removed from the installation position; and a wireless communication circuit, located in the case and coupled to the power off switch and the temporary power storage circuit.

10 Claims, 4 Drawing Sheets

(56) References Cited

U.S. PATENT DOCUMENTS

| | | | | |
|---|---|---|---|---|
| 8,707,059 B2* | 4/2014 | Christianson | | G08B 29/046 340/531 |
| 10,482,758 B1* | 11/2019 | Nye | | G08B 29/06 |
| 10,496,854 B1* | 12/2019 | Lillestolen | | G06F 1/3206 |
| 2004/0041703 A1* | 3/2004 | Bergman | | G08B 25/10 340/514 |
| 2004/0124980 A1* | 7/2004 | Sisson | | G08B 13/149 340/568.1 |
| 2005/0003845 A1* | 1/2005 | Pollard | | G08B 17/00 455/521 |
| 2005/0179555 A1* | 8/2005 | Higashiyama | | G06F 21/86 340/686.1 |
| 2007/0196156 A1* | 8/2007 | Lewis | | G06F 3/0395 400/691 |
| 2007/0200679 A1* | 8/2007 | Colby | | G06K 19/07345 340/10.51 |
| 2007/0229026 A1* | 10/2007 | Morioka | | H02J 7/0031 320/112 |
| 2008/0079313 A1* | 4/2008 | Ellingsworth | | B60R 25/24 307/10.3 |
| 2009/0315669 A1* | 12/2009 | Lang | | E05B 65/104 340/3.1 |
| 2010/0031368 A1* | 2/2010 | Park | | G06F 21/86 726/26 |
| 2010/0071077 A1* | 3/2010 | Morris | | G06F 21/55 726/36 |
| 2011/0031985 A1* | 2/2011 | Johnson | | G08B 13/1418 324/681 |
| 2013/0019114 A1* | 1/2013 | Sumida | | G06F 1/263 713/300 |
| 2014/0277609 A1* | 9/2014 | Nye | | G05B 19/048 700/79 |
| 2016/0154981 A1* | 6/2016 | Wesselhoff | | G07F 19/207 726/34 |
| 2018/0204024 A1* | 7/2018 | Lillibridge | | G06F 21/74 |
| 2019/0073493 A1* | 3/2019 | Wesselhoff | | G06F 21/74 |
| 2020/0026115 A1* | 1/2020 | Froment | | G06F 21/86 |
| 2020/0134233 A1* | 4/2020 | Lillestolen | | G06F 1/182 |
| 2020/0134241 A1* | 4/2020 | Lillestolen | | G08B 13/149 |

\* cited by examiner

ELECTRONIC DEVICE THAT CAN DETECT AND REPORT TAMPERING

CROSS REFERENCE TO RELATED APPLICATION

This application claims priority to China Patent Application No. 201821648510.X, filed on Oct. 11, 2018. The contents thereof are incorporated herein by reference.

BACKGROUND OF THE INVENTION

1. Field of the Invention

The present invention relates to an electronic device that can detect tampering, and particularly relates to an electronic device which integrates a power source switch and a tamper switch to the same switch.

2. Description of the Prior Art

A conventional electronic device may comprise a tamper switch to detect if the electronic device has been tampered or has been disassembled. However, such tamper switch may increase a size or a manufacturing cost of the electronic device. Besides, the complexity for installing such electronic device also increases.

SUMMARY OF THE INVENTION

Therefore, one objective of the present invention is to provide an electronic device which can automatically switch to a power off state, and integrates the power source switch and the tamper switch to a single switch.

One embodiment of the present invention discloses an electronic device that can detect and report tampering, comprising: a case, comprising an installation surface, wherein the electronic device is for being installed to an installation position via the installation surface; a battery, located inside the case, configured to provide battery power; a temporary power storage circuit, located in the case; a power off switch, located on the case and coupled between the battery and the temporary power storage circuit, configured to operate in a conductive state while the electronic device is installed at the installation position, and configured to automatically operate in a power off state after the electronic device being removed from the installation position; and a wireless communication circuit, located in the case and coupled to the power off switch and the temporary power storage circuit.

In view of above-mentioned embodiments, the tamper switch and the power source switch can be integrated to a single switch, to decrease the size and the manufacturing cost of the electronic device. Such structure is a great advantage while the electronic device is an IOT (Internet of Things) device with a small size. Additionally, the electronic device does not operate until it is correctly installed, thus non-necessary battery power consumption can be avoided. Such mechanism is also a great advantage while the electronic device is an IOT device with limited power.

These and other objectives of the present invention will no doubt become obvious to those of ordinary skill in the art after reading the following detailed description of the preferred embodiment that is illustrated in the various figures and drawings.

DETAILED DESCRIPTION

In following descriptions, a plurality of embodiments are provided to explain the concept of the present invention. Please note, each component in following embodiments can be implemented by hardware (e.g. device, circuit) or hardware with software (e.g. a processor with at least one program).

Figure 1:
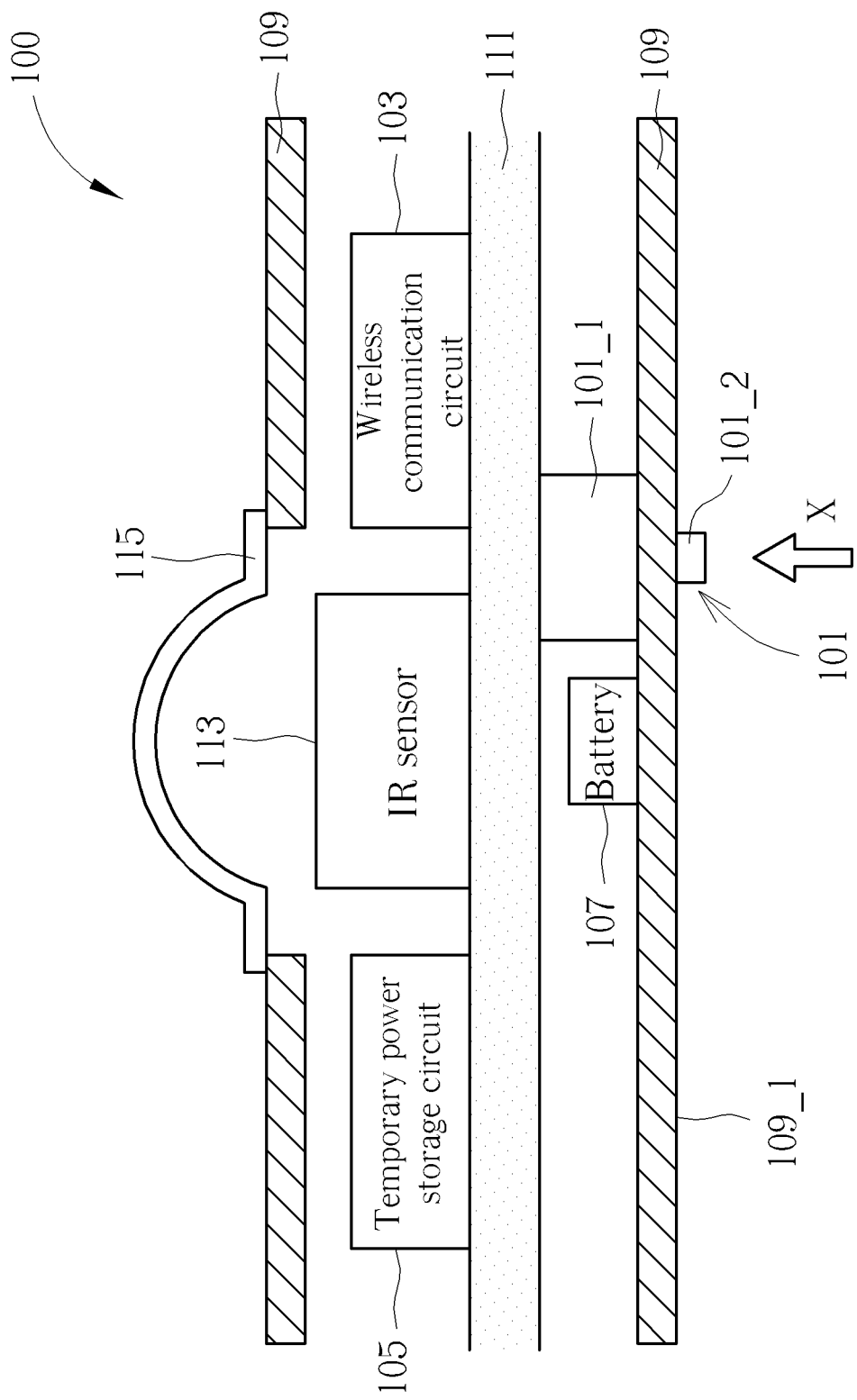
FIG. 1 is a schematic diagram illustrating an internal structure of an electronic device according to one embodiment of the present invention.
Figure 2:
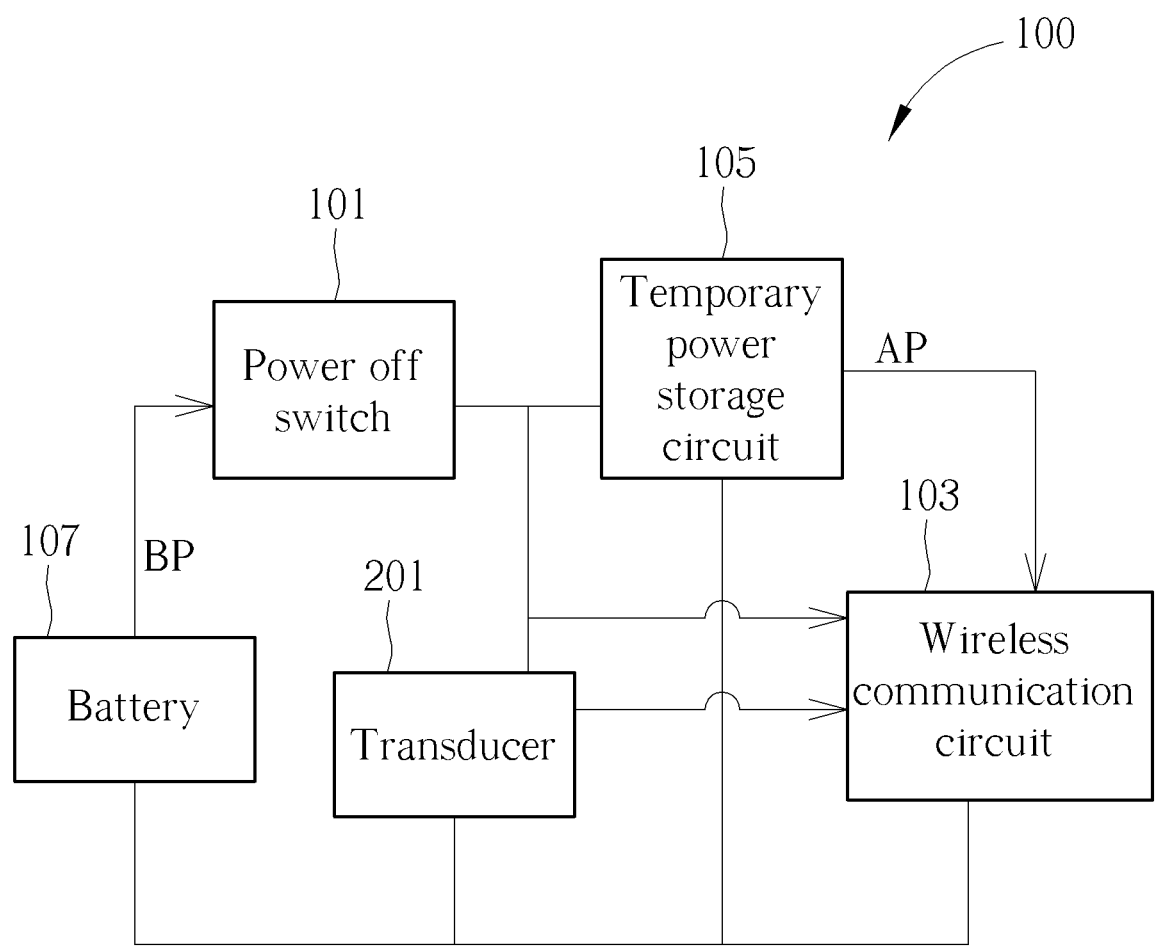
FIG. 2 is a block diagram illustrating an electronic device according to one embodiment of the present invention.

FIG. 1 is a schematic diagram illustrating an internal structure of an electronic device according to one embodiment of the present invention. FIG. 2 is a block diagram illustrating an electronic device according to one embodiment of the present invention, which illustrates electrical connections between each component. Please refer to FIG. 1 and FIG. 2 to understand the concept of the present invention. Please note, the arrangements illustrated in FIG. 1 and FIG. 2 are only for examples and do not mean to limit the scope of the present application, any arrangement that can reach the same function should fall in the scope of the present invention.

As illustrated in FIG. 1 and FIG. 2, the electronic device 100 comprises a power off switch 101, a wireless communication circuit 103, a temporary power storage circuit 105, a battery 107, a case 109 and a circuit board 111. The wireless communication circuit 103, the temporary power storage circuit 105, the battery 107, and the circuit board 111 are in the case 109, and the wireless circuit 103, the temporary power storage circuit 105 are provided on the circuit board 111. The installation surface 109_1 is a surface of the case 109, such as a back surface or a bottom surface of the electronic device 100. The electronic device 100 can be installed to an installation position via the installation surface 109_1. The installation position can be a surface of any object, such as a surface of a wall, a door, a window, a ceiling, a ground, a surface mount or a wall mount. In one embodiment, the power off switch 101 comprises a body part 101_1 installed to the circuit board 111 and comprises a switch part 101_2 protruding from the installation surface 109_1.

The battery 107 is configured to provide the battery power BP, and can be any kind of battery, such as a coin battery or an AA/AAA battery. The power off switch 101 is coupled to the battery 107 to receive the battery power BP. Also, the power off switch 101 operates in a conductive state while the electronic device 100 is installed at the installation position, and automatically operates in a power off state after the electronic device 100 is removed from the installation position. The temporary power storage circuit 105 is coupled to the power off switch 101. Also, the temporary power storage circuit 105 is indirectly coupled to the battery 107 and receives the battery power BP from the battery 107, and temporarily stores at least partial of the battery power BP as auxiliary power AP, when the power off switch 101 operates in the conductive state. The wireless communication circuit 103 is coupled to the power off switch 101 and the temporary power storage circuit 105. When the power off switch operates 101 in the power off state, the wireless communication circuit 103 could not receive the battery power BP from the battery 107 but can temporarily receive the auxiliary power AP from the temporary power storage circuit 105, and use the auxiliary power AP to send a message. In this embodiment, the temporary power storage circuit 105 does not output the auxiliary power AP to the transducer 201, thus the transducer 201 loses power and could not operate when the power off switch 101 switches to a power off state.

In one embodiment, the temporary power storage circuit 105 is a dying gasp circuit, which can provide the auxiliary power AP to the wireless communication circuit 103. The wireless communication circuit 103 can be connected to the power off switch 101. Besides, an analog to digital converting circuit could be included therein to continuously detect the voltage output by the power off switch 101. If the voltage output by the power off switch 101 suddenly drops (e.g. the power off switch 101 switches from the conductive state to the power off state) or is lower than a threshold value, the wireless communication circuit 103 can generate an internal interrupt, thereby the wireless communication circuit 103 can use the auxiliary power AP to output a message (e.g. a dying gasp). In one embodiment, the temporary power storage circuit 105 comprises a capacitor to temporarily store the battery power BP. The capacitance value of this capacitor corresponds to the wireless communication standard applied by the wireless communication circuit 103, since different wireless communication standards always have different message lengths. For example, the minimum stored battery power BP in the capacitor is the power which is enough for the wireless communication circuit 103 to generate a wireless message to inform a remote electronic device that the installation state of the electronic device 100 has changed. In other words, the battery power BP which is needed to be temporarily stored is related to the necessary power for the wireless communication circuit 103 to output the message one time. Therefore, a bigger capacitor is needed if the wireless communication circuit 103 uses a wireless communication standard consuming more power (e.g. WiFi). In contrast, a smaller capacitor is needed if the wireless communication circuit 103 uses a wireless communication standard consuming less power (e.g. Bluetooth Low Energy or Zigbee). Of course, it can be designed to be that the temporary power storage circuit 105 detects the voltage output by the power off switch 101, and transmits an interrupt to the wireless communication circuit 103 when the output voltage suddenly drops, thereby the wireless communication circuit 103 can use auxiliary power to output the message (e.g. a dying gasp).

In following descriptions, an exemplary structure and operations of the power off switch 101 will be described. In one embodiment, once the electronic device 100 is properly installed, the power off switch 101 will receive a continuous external force. In one embodiment, the continuous external force is a push force X provided by the installation position at which the electronic device 100 is installed. In such case, if the electronic device 100 is not tampered, the installation position continuously provides the push force X to keep the power off switch 101 operating in the conductive state. However, if the electronic device 100 is tampered and is moved away from the installation position, the push force X decreases or disappears, thereby the power off switch 101 automatically switches to the power off state.

Figure 3:
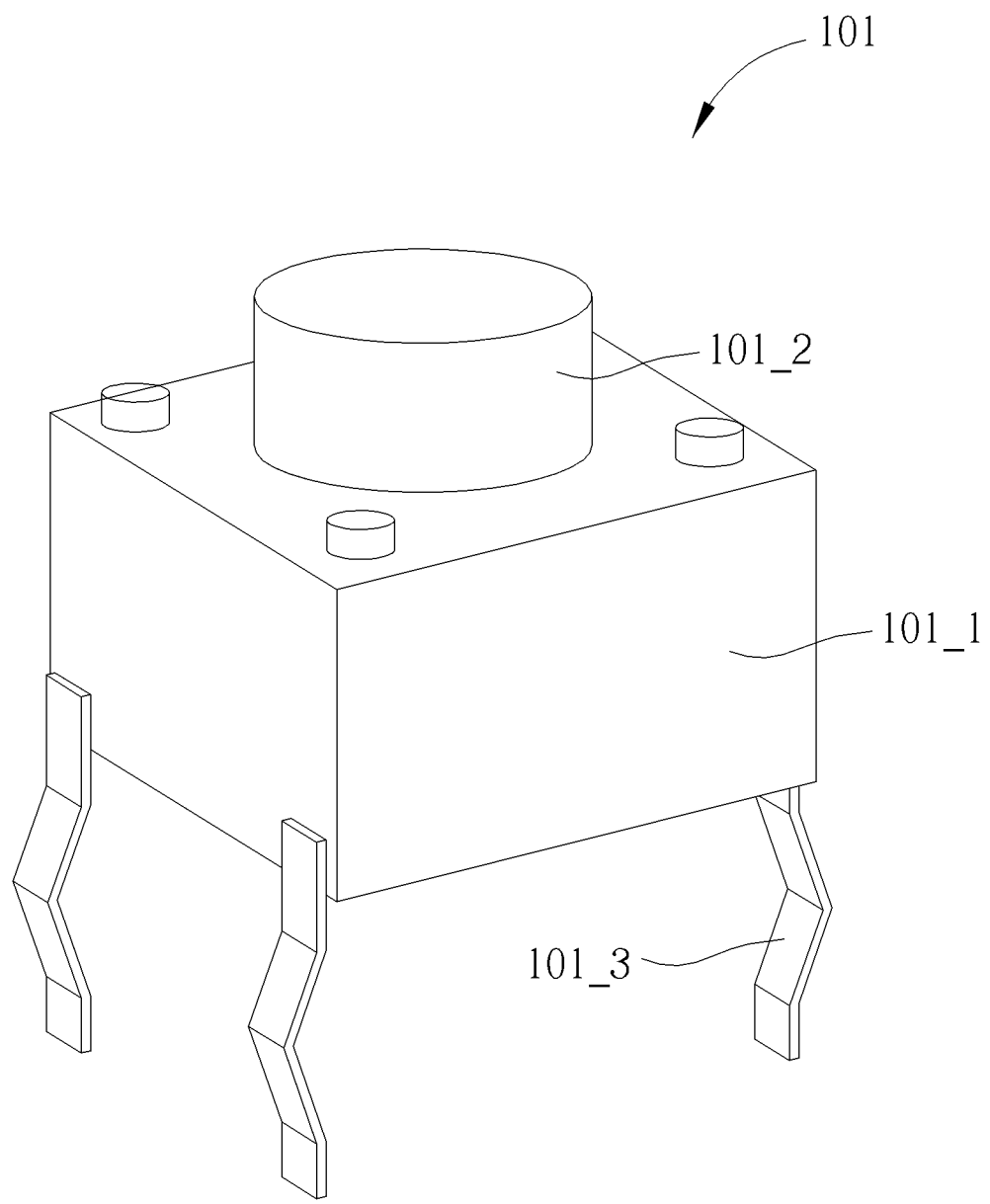
FIG. 3 is a schematic diagram illustrating an example for the power off switch illustrated in FIG. 1. Any similar switch could also do the same job.
Figure 4:
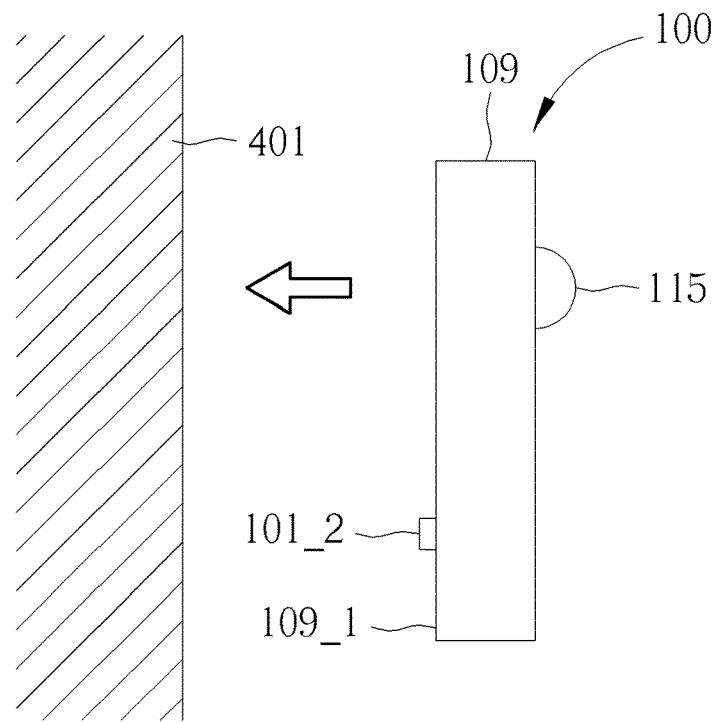
FIG. 4 is a schematic diagram illustrating an outer appearance of an electronic device according to one embodiment of the present invention.

Please refer to FIG. 3, which illustrates one example of the power off switch 101. In this example, the power off switch 101 is a tactile switch or a tact switch, which comprises a body part 101_1, a switch part 101_2 and a pin part 101_3. The pin part 101_3 is installed in the circuit board 111 illustrated in FIG. 1, the body part 101_1 is located in the case 109, and the switch part 101_2 protrudes from the installation surface 109_1 of the case 109 outward. At least part of the switch part 101_2 retracts into the body part 101_1 while receiving the push force, to make the power off switch 101 operate in the conductive state. Also, the switch part 101_2 automatically springs back when receives no push force, to make the power off switch 101 operates in the power off state. Therefore, if the electronic device 100 is installed at the wall 401 (i.e. one example of the above-mentioned installation position) as shown in FIG. 4, the switch part 101_2 protrudes from the installation surface 109_1 which receives the push force provided by the wall 401 such that at least part of the switch part 101_2 retracts into the body part 101_1, thus the power off switch 101 operates in the conductive state. If the electronic device 100 is tampered or removed from the wall 401, the push force provided by the wall 401 decreases or disappears, thus the switch part 101_2 automatically springs back to make the power off switch 101 operates in the power off state. However, the power off switch 101 is not limited to a tact switch, any switch that can operate in a conductive state while receiving a continuous external force and automatically switches to the power off state while receiving no continuous external force should fall in the scope of the present invention.

In one embodiment, the electronic device 100 is a security device, thus comprises the transducer 201 illustrated in FIG. 2, which can transform first type energy to second type energy. The wireless communication circuit 103 can report a situation detected by the transducer 201 periodically, and/or generates wireless messages when the transducer 201 detects abnormal situations. Additionally, the message generated by the wireless communication circuit 103 after the power off switch 101 switches from the conductive state to the power The electronic device 100 can determine if any people is moving in front of the electronic device 100 via the IR sensor 113 when the power off switch 101 operates in the conductive state. If the power off switch 101 automatically switches from the conductive state to the power off state due to the tampering or the removing of the electronic device 100, the wireless communication circuit 103 generates a warning message to inform the remote device/host. In such case, the above-mentioned first type energy is optical energy and the second type energy is electric energy.

Figure 5:
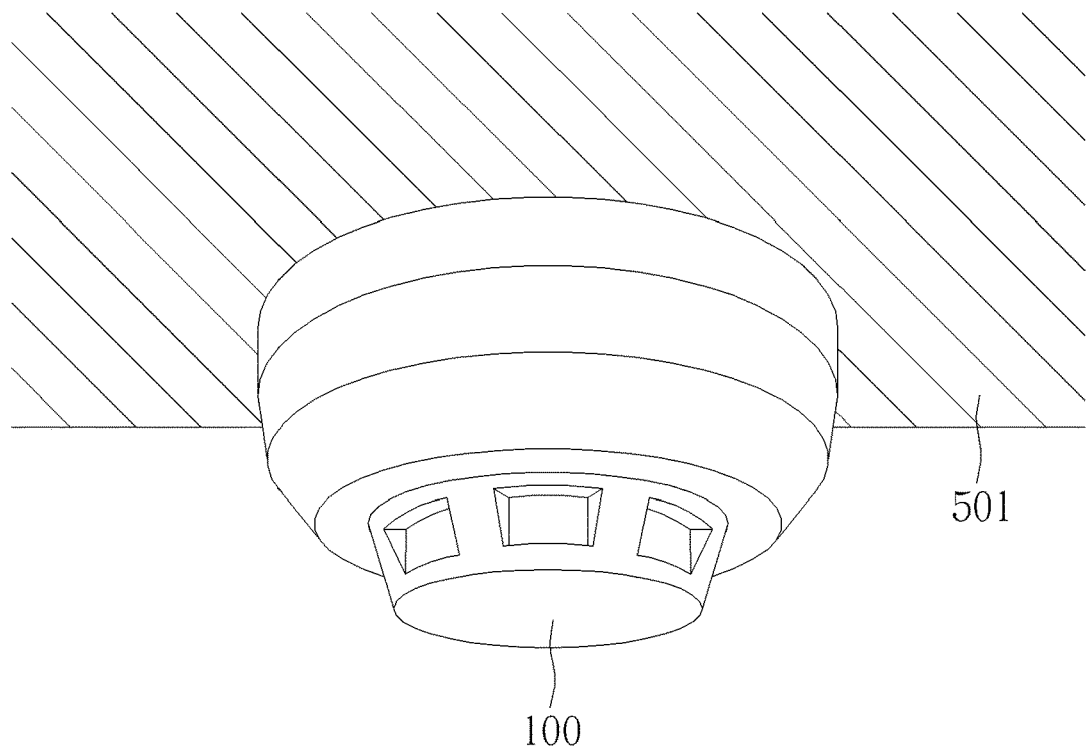
FIG. 5 is a schematic diagram illustrating an outer appearance of an electronic device according to another embodiment of the present invention.

Please note, the transducer 201 is not limited to the image sensor 113 illustrated in the above-mentioned FIG. 1, but can be any type of transducer. In the embodiment of FIG. 5, the electronic device 100 is a fire sensor and can be installed to the ceiling 501 (i.e. one example of the above-mentioned installation position). In such case, the above-mentioned first type energy is thermal energy and the second type energy is electric energy. If the electronic device 100 is installed to the ceiling 501, the ceiling 501 can provide push force to the power off switch 101. By this way, the power off switch 101 operates in the conductive state, thus the electronic 100 can normally detect the thermal energy. After the power off switch 101 switches to the power off state due to the tampering or removing of the electronic device 100, the electronic device 100 outputs the warning message to the user as above-mentioned, and then stops operating.

In view of above-mentioned embodiments, the tamper switch and the power source switch can be integrated to a single switch, to decrease the size and the manufacturing cost of the electronic device 100. Such structure is a great advantage while the electronic device 100 is an IOT device with a small size. Additionally, the electronic device 100 does not operate until it is correctly installed, thus non-necessary battery power consumption can be avoided. Such mechanism is also a great advantage while the electronic device 100 is an IOT device with limited power.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An electronic device that can detect and report tampering, comprising:
    a case, comprising an installation surface, wherein the electronic device is for being installed to an installation position via the installation surface;
    a battery, located inside the case, configured to provide battery power;
    a temporary power storage circuit, located in the case;
    a power off switch, located on the case and coupled between the battery and the temporary power storage circuit, configured to operate in a conductive state while the electronic device is installed at the installation position, and configured to automatically operate in a power off state after the electronic device being removed from the installation position; and
    a wireless communication circuit, located in the case and coupled to the power off switch and the temporary power storage circuit.

2. The electronic device of claim 1,
    wherein the power off switch receives a continuous external force and operates in the conductive state to provide the battery power to the temporary power storage circuit and the wireless communication circuit, when the electronic device is installed at the installation position;
    wherein the power off switch does not receive the continuous external force and automatically operate in the power off state when the electronic device is not installed at the installation position.

3. The electronic device of claim 2, wherein the continuous external force which the power off switch receives when the electronic device is installed at the installation position is a push force which the installation position provides to the power off switch, where the power off switch protrudes from the installation surface.

4. The electronic device of claim 1, wherein the power off switch is a tact switch.

5. The electronic device of claim 1,
    wherein the temporary power storage circuit receives the battery power from the battery and temporarily stores the battery power as auxiliary power, when the power off switch operates in the conductive state;
    wherein the wireless communication circuit could not receive the battery power from the battery but receives the auxiliary power from the temporary power storage circuit and uses the auxiliary power to send a message, when the power off switch operates in the power off state.

6. The electronic device of claim 1, further comprising:
    a transducer, coupled to the power off switch, configured to transform first type energy to second type energy, wherein the transducer receives the battery power to operate when the power off switch operates in the conductive state, and stops operating when the power off switch operate in the power off state.

7. The electronic device of claim 6, wherein the electronic device is a security device and the message is a warning message.

8. The electronic device of claim 6,
    wherein the temporary power storage circuit receives the battery power from the battery and temporarily stores the battery power as auxiliary power, when the power off switch operates in the conductive state;
    wherein the temporary power storage circuit outputs the auxiliary power to the wireless communication circuit but does not output to the transducer, when the power off switch operates in the power off state.

9. The electronic device of claim 1, wherein the installation surface is a back surface or a bottom surface of the electronic device.

10. The electronic device of claim 1, wherein the temporary power storage circuit comprises a capacitor to temporarily store the battery power, and the battery power stored in the capacitor is enough for the wireless communication circuit to output a wireless message to inform that an installation state change.

\* \* \* \* \*